United States Patent [19]
Fitzpatrick et al.

[11] Patent Number: 6,128,479
[45] Date of Patent: Oct. 3, 2000

[54] RADIO FREQUENCY AMPLIFIER STRUCTURE

[75] Inventors: Douglas D. Fitzpatrick, Palatine; William S. Goumas, Chicago, both of Ill.

[73] Assignee: Motorola, Inc., Schaumburg, Ill.

[21] Appl. No.: 09/089,870

[22] Filed: Jun. 4, 1998

[51] Int. Cl.[7] .................................................. H04B 17/02
[52] U.S. Cl. .................. 455/137; 455/191.1; 455/250.1; 455/251.1; 330/295; 330/51
[58] Field of Search ............................... 455/91, 127, 126, 455/132, 133, 137, 296, 280; 330/151, 51, 52, 300–306, 285–296

[56] References Cited

U.S. PATENT DOCUMENTS

| | | | |
|---|---|---|---|
| 4,380,738 | 4/1983 | Wagner | 330/151 |
| 4,893,093 | 1/1990 | Cronauer et al. | 330/295 |
| 5,304,943 | 4/1994 | Koontz | 330/51 |
| 5,826,181 | 10/1998 | Reed | 455/312 |
| 5,831,479 | 11/1998 | Leffel | 330/124 D |

*Primary Examiner*—William G. Trost
*Assistant Examiner*—Charles Craver
*Attorney, Agent, or Firm*—Daniel C. Crilly; Steven A. May; Jeffrey K. Jacobs

[57] ABSTRACT

A radio frequency (RF) circuit (300) includes two parallel sections (310, 312) that are designed to function collectively through the use of a signal splitter/switching circuit (200) and a signal combiner (314). To optimize the performance of the RF circuit (300), a switching arrangement (214, 216, 218, 220, 222, 224, 226, 228, and 230) that is part of the signal splitter/switching circuit (200) is used to separate and isolate the two parallel sections (310, 312) for tuning purposes. After each parallel section (310, 312) has been individually tuned, the two parallel sections (310, 312) are recombined for joint operation.

12 Claims, 5 Drawing Sheets

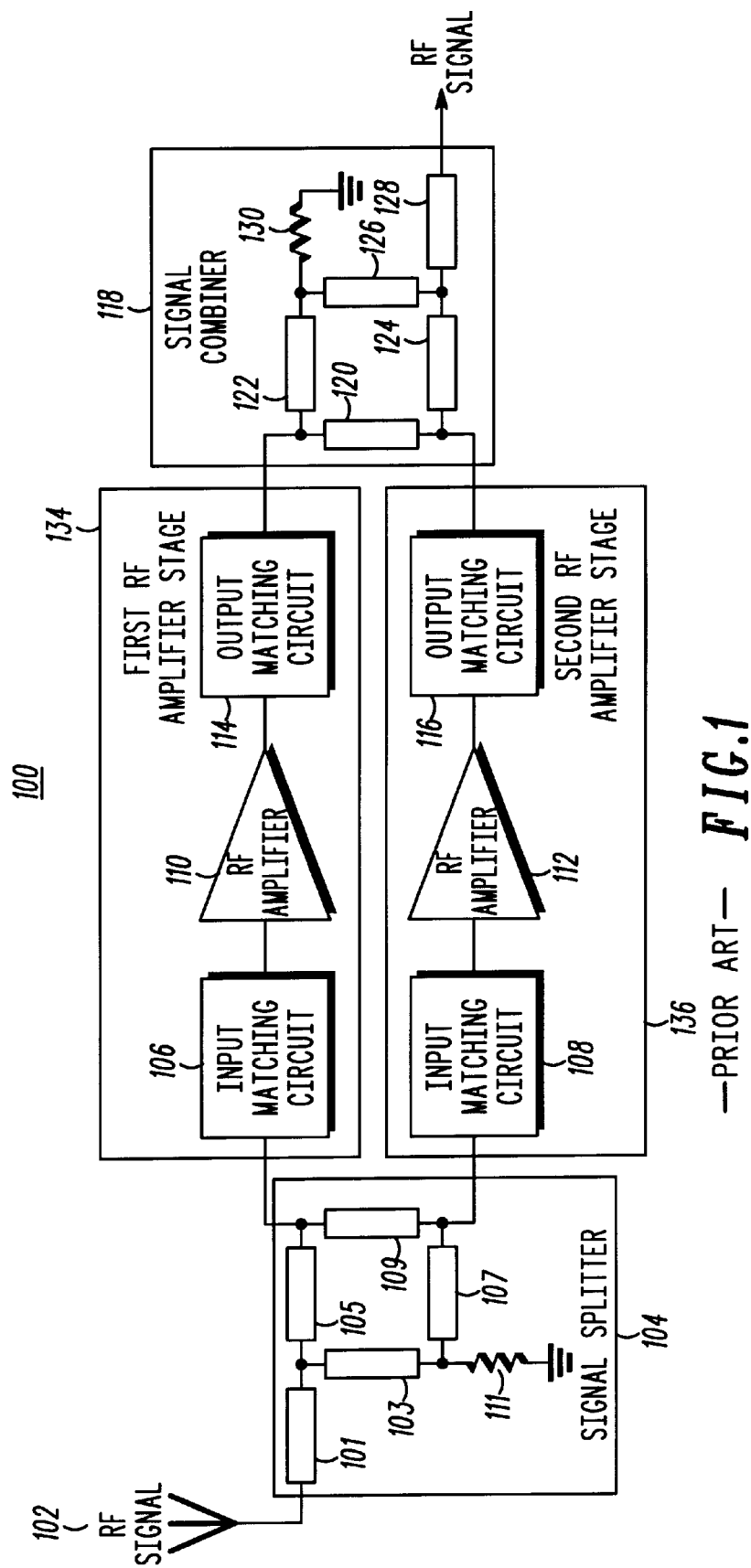
FIG.1 —PRIOR ART—

RADIO FREQUENCY AMPLIFIER STRUCTURE

FIELD OF THE INVENTION

This invention relates generally to communication devices, and in particular to a Radio Frequency amplifier portion of a communication device.

BACKGROUND OF THE INVENTION

With the fierce global competition and rapid technological advancements that are being made in the field of wireless communications, there is the constant need to improve product quality, to reduce product cost, and to improve performance of communication devices. One of the more costly components in a radio frequency (RF) communication device is the RF power amplifier.

A class of RF power amplifiers achieve high RF power by operating RF amplifier circuits in parallel, splitting one or more RF signals among the inputs to each of those parallel circuits. A block diagram of such an RF power amplifier configuration is shown in FIG. 1. An RF power amplifier 100 comprises a first and a second RF amplifier stage 134 and 136 configured to operate in parallel, a signal splitter 104, and a signal combiner 118. The first and second RF amplifier stages 134 and 136 each typically include an RF amplifier 110 and 112, an input matching circuit 106 and 108, and an output matching circuit 114 and 116.

The signal splitter 104 is a hybrid splitter that typically comprises transmission lines 101, 103, 105, 107, and 109, and a resistor 111. The impedance values of these transmission lines and resistor may vary depending upon the input impedance of the input matching circuits 106 and 108 and the output impedance of the circuit preceding the signal splitter 104, since there is a transformation from the former impedance to the latter impedance. Similarly, the signal combiner 118 illustrated here is a hybrid combiner that typically comprises transmission lines 120, 122, 124, 126, and 128 and a resistor 130. Again, the impedance values of these transmission lines and resistor may vary depending upon the output impedance of the output matching circuits 114 and 116 and the input impedance of the circuit succeeding the signal combiner 118.

When an RF signal 102 is applied to the RF power amplifier 100, the signal splitter 104 divides the RF signal power equally between the two RF amplifier stages 134 and 136. The signal splitter transmission line 109 is designed to be one-quarter wavelength long. As a result, the RF signal input into the first RF amplifier stage 134 is 90 degrees out of phase from the RF signal input into the second RF amplifier stage 136. Reflections by the two amplifier stages 134 and 136 of signals of equal amplitude and phase will cancel each other out when combined in the signal splitter 104, which cancellation will improve the return loss (the ratio of reflected input power to input power) performance of the RF power amplifier.

Cost reductions have been achieved by reducing the space consumed by these parallel RF power amplifier circuits 134 and 136 and placing them on a single circuit board, along with their associated signal splitters 104 and combiners 118. Further cost and quality improvements have been achieved by automating the manufacturing processes, and additional areas of automation are always being explored. One such area of automation is the tuning of the RF power amplifier circuits to optimize their RF performance. However, a problem exists with respect to the automated tuning of each of two or more parallel RF amplifier stages on the same circuit board when the RF input to each stage cannot be automatically isolated during the tuning process. If the RF input to each stage cannot be isolated, then the performance of that stage cannot be individually observed and individually tuned (optimized). The signal splitter provides power to all parallel stages and therefore measurements such as efficiency, gain, output power and return loss that are made during the tuning procedure are an aggregate of the performance of all of the stages. Furthermore, the return loss performance is a product of RF power reflecting back from all of the stages to which RF power is provided, and the use of a hybrid signal splitter will cause the reflected power from individual stages to cancel out in the splitter. Thus the individual stages could be reflecting back most of their input power, resulting in little of the input RF signal being amplified, but the RF power amplifier's return loss could appear to be very good and there would be little clue as to why the RF power amplifier's gain and output power would be particularly low. Hence there is a need for an apparatus that will optimize the tuning of amplifier circuits while overcoming the deficiencies of the prior art.

BRIEF DESCRIPTION OF THE DRAWINGS

FIG. 1 is a block diagram and schematic illustration of a typical radio frequency (RF) amplifier structure of the prior art.

DESCRIPTION OF A PREFERRED EMBODIMENT

Generally, the present invention encompasses an apparatus for automated tuning of parallel circuits connected to a signal splitter. The apparatus includes a switching arrangement that comprises a circuit of transmission lines and automated switches. The switching arrangement couples to a circuit, such as a signal splitter circuit or a signal combiner circuit, that accepts power from one or more input ports and then distributes that power to one or more output ports. By attaching such an arrangement to a signal splitter, the user can, by opening various combinations of switches, individually isolate the radio frequency (RF) outputs of the splitter and route the RF signal(s) entering the splitter to a particular RF output of the splitter. This signal manipulation provides for automated optimization tuning of individual splitter circuits with minimum impact from other circuit components.

Figure 2:
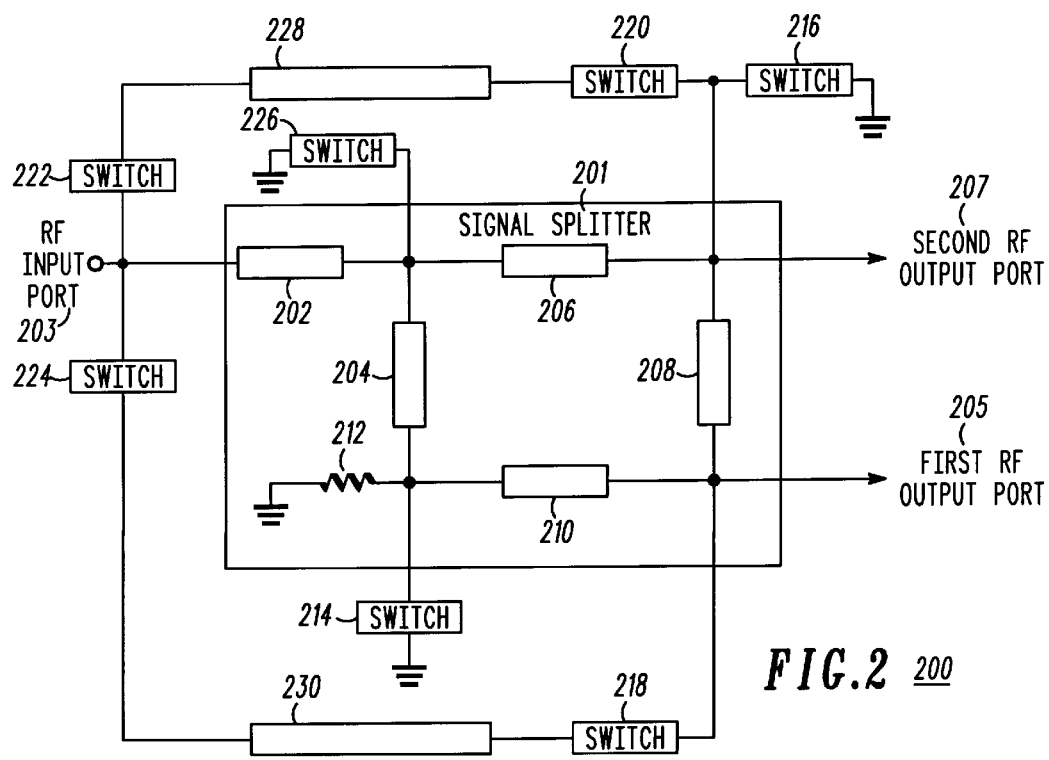
FIG. 2 is a schematic diagram of a switching arrangement coupled to a signal splitter in accordance with the present invention.

The present invention can be more fully understood with reference to FIGS. 2–6. FIG. 2 illustrates a signal splitter/switching circuit 200 in accordance with a preferred embodiment of the present invention. In FIG. 2, a switching arrangement is shown coupled to a signal splitter 201. The signal splitter 201 comprises transmission lines 202, 204, 206, 208, and 210, a resistor 212, an RF input port 203, and first and second RF output ports 205 and 207. The switching arrangement comprises seven switches 214, 216, 218, 220, 222, 224, and 226, and two transmission lines 228 and 230. The impedance values of the transmission lines and resistor may vary depending upon the output impedances of the circuits preceding the signal splitter 201 and the input impedances of the circuits succeeding the signal splitter 201, since there is a transformation from the former impedances to the latter impedances.

In the preferred embodiment, transmission lines 228 and 230 have electrical lengths of ¾ wavelength at an operating frequency. The proper functioning of this switching arrangement utilizes the properties of a ¼, or ¾, wavelength transmission line, which when shorted at one end has the characteristics of an open circuit at the opposite end and when open at one end has the characteristics of a short circuit at the opposite end. Also, in the preferred embodiment switches 214, 216, 218, 220, 222, 224, and 226 are laser trimmable copper strip line, i.e., a copper strip line that can be severed by a laser beam. Copper strip line switches and transmission lines are inexpensive to realize and require no additional components. In alternate embodiments of the present invention, the switches can be any kind of switch that can be opened in an automated fashion, including but not limited to pin diodes, mechanical switches, one shot switches, and switches whose connections can be erased in some manner such as a laser trimmable copper or silver strip line. In yet other alternate embodiments of the present invention, at least one transmission line in the switching arrangement may be ¼ wavelength long or any factor of (2n−1)/4 wavelengths long, where n=1,2,3, . . .

When all switches 214, 216, 218, 220, 222, 224, and 226 are closed, the RF input port 203 of the signal splitter 201 is connected to the first RF output port 205 and isolated from the second RF output port 207. An RF signal input into the RF input port 203 will be routed to the first RF output port 205 only. When switches 216 and 224 are opened, the RF input port 203 will be connected to the second RF output port 207 and will be isolated from the first RF output port 205, so that an RF signal input into the RF input port 203 will be routed to the second RF output port 207 only. Opening the remaining switches (switches 214, 218, 220, 222, and 226) will then decouple the switching arrangement from the signal splitter 201. The RF input port 203 will be connected to both the first and second RF output ports 205 and 207 and an RF signal input at the RF input port 203 will be split between the two RF output ports 205 and 207.

Figure 3:
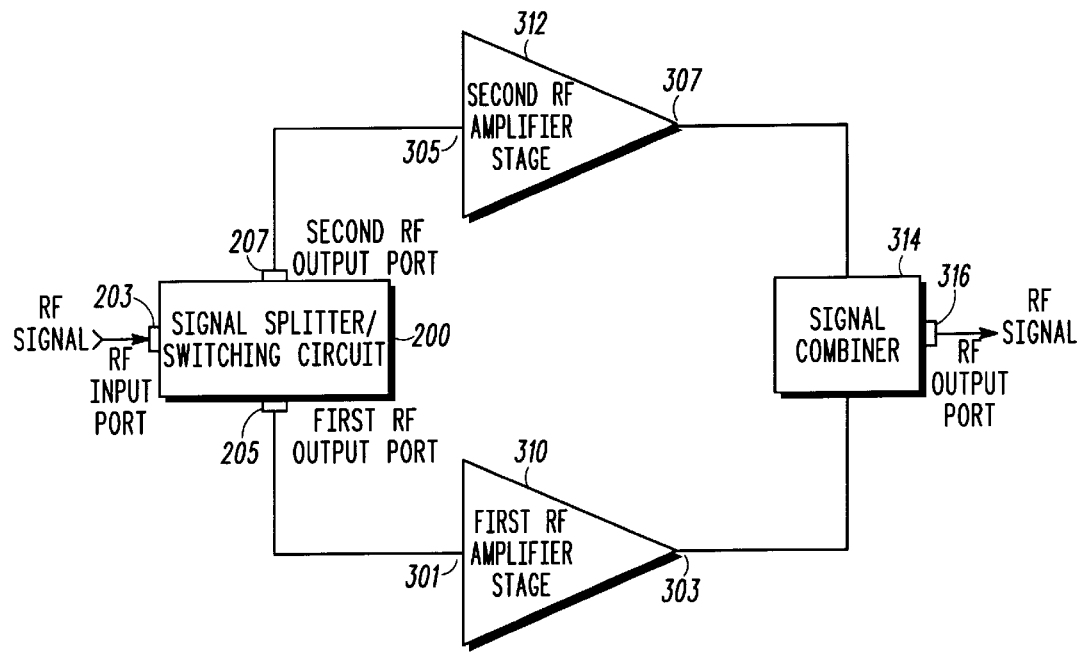
FIG. 3 is a block diagram illustration of an RF amplifier structure in accordance with the present invention.

FIG. 3 illustrates an RF amplifier structure 300 that includes the signal splitter/switching circuit 200. The RF amplifier structure 300 comprises a signal splitter/switching circuit (a tuning enhancer circuit) 200 with an RF input port 203 and first and second RF output ports 205 and 207, a signal combiner 314 with an RF output port 316, and first and second RF amplifier stages 310 and 312 whose inputs, 301 and 305, are coupled to the RF output ports 205 and 207 of the signal splitter/switching circuit 200 and whose outputs, 303 and 307, are coupled to the signal combiner 314.

An RF signal is input into the RF input port 203 of the signal splitter/switching circuit 200. The signal splitter/switching circuit 200 first routes the RF signal exclusively to the first RF output port 205, which is connected to the first RF amplifier stage 310. The first RF amplifier stage 310 may then be individually tuned and its individual performance parameters, such as its return loss, efficiency, gain, and output power, measured and optimized at the RF input port 203 of the signal splitter/switching circuit 200 and at the RF output port 316 of the signal combiner 314. By opening particular switches in the signal splitter/switching circuit 200, an RF signal input at the RF input port 203 is next routed exclusively to the second RF output port 207, which is connected to the second RF amplifier stage 312. The second RF amplifier stage 312 can then be tuned and its individual performance parameters measured and optimized at the RF input port 203 and the RF output port 316. After both the first and second RF amplifier stages 310 and 312 have been individually tuned for optimum performance, the opening of additional switches in the signal splitter/switching circuit 200 will decouple the switching arrangement from the signal splitter and allow an RF signal input at the RF input port 203 to be split between both the first and second RF output ports, 205 and 207. By isolating each RF amplifier stage 310 and 312 and then separately tuning and measuring their performance parameters, the individual performance of each amplifier stage and the overall performance of the parallel amplifier arrangement 300 can be optimized.

In general, the signal splitter/switching circuit 200 is a tuning enhancer circuit that improves the performance of the first and second RF amplifier stages 310 and 312 by selectively routing the RF signal to the inputs of each stage 310 and 312, effectively isolating each stage and allowing it to be selectively and individually tuned for optimum performance. After all stages 310 and 312 have been tuned, opening additional switches will decouple the switching arrangement from the signal splitter and allow the RF signal(s) to be split among all RF amplifier stages 310 and 312. By isolating each one of two or more parallel stages 310 and 312 during the tuning process, measurements such as efficiency, gain, output power and return loss can be made for each stage individually. Thus each stage 310 and 312 can be tuned to its optimal performance, eliminating situations where splitter design can obscure poor individual stage performance and result in a sub-optimally tuned power amplifier. Also, isolation of each stage 310 and 312 would permit s-parameter S11 and S21 frequency sweeps (injecting into each stage a frequency swept input signal in addition to the RF carrier) for each stage, which is a valuable tool for analyzing that stage's stability. Furthermore, the switches are never subsequently closed after they have been opened, which allows for the use of low cost switches such as laser trimmable transmission lines, that can be added to a circuit at no additional cost.

Figure 4:
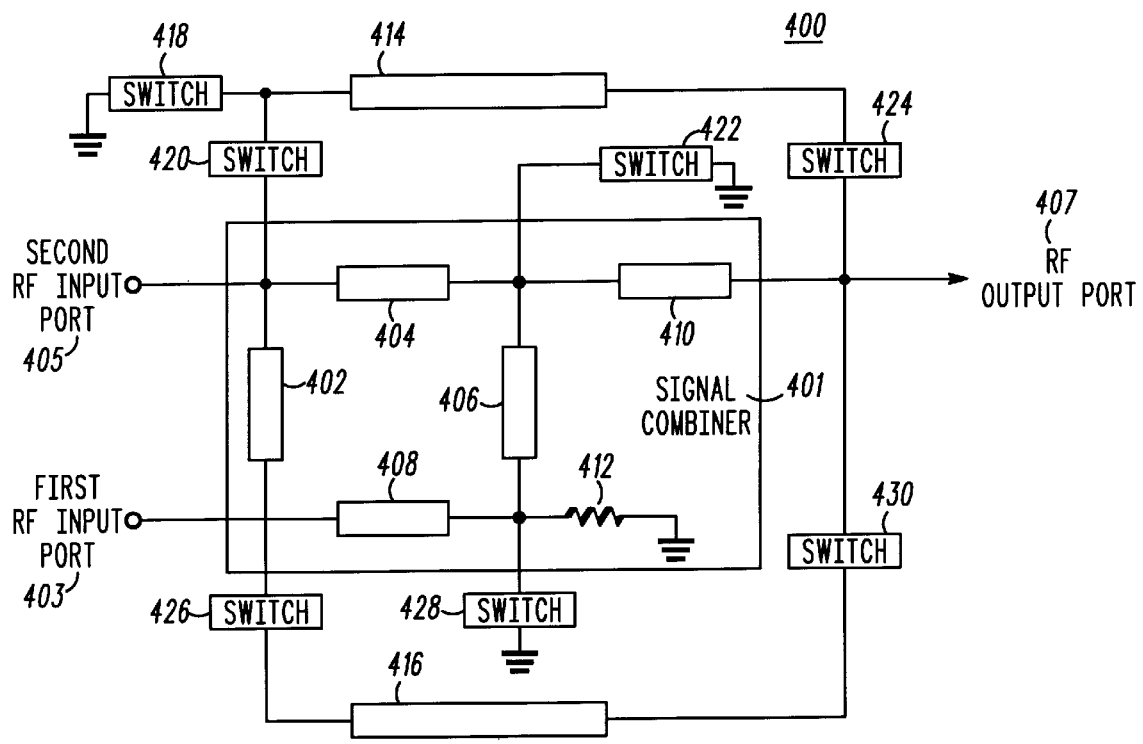
FIG. 4 is a schematic diagram of a switching arrangement coupled to a signal combiner in accordance with the present invention.

FIG. 4 illustrates an alternative embodiment of a radio frequency amplifier structure 400 in accordance with the present invention, where a switching arrangement is shown coupled to a signal combiner 401. The signal combiner 401 comprises transmission lines 402, 404, 406, 408, 410, a resistor 412, a first and second RF input port 403 and 405, and an RF output port 407. The switching arrangement comprises seven switches 418, 420, 422, 424, 426, 428, and 430, and two transmission lines 414 and 416. The impedance values of these transmission lines and resistor may vary depending upon the output impedances of the circuits preceding the signal combiner 401 and the input impedances of the circuits succeeding the signal combiner 401, since there is a transformation from the former impedances to the latter impedances.

The operation of the signal combiner 401 and switching arrangement in FIG. 4 is very similar to that of the signal splitter and switching arrangement described in FIG. 2. When all switches 418, 420, 422, 424, 426, 428, and 430 are closed, the RF output port (the signal combiner output) 407 will be connected to the first RF input port 403 and isolated from the second RF input port 405, so that only an RF signal from the first RF input port 403 will be routed to the combiner output 407. When switches 418 and 430 are opened, the RF output port 407 will be connected to the second RF input port 405 and isolated from the first RF input port 403, so that only an RF signal from the second RF input port 405 will be routed to the combiner output 407. Opening the remaining switches (switches 420, 422, 424, 426, and 428) will decouple the switching arrangement from the signal combiner 401. The RF output port 407 will be connected to both the first and second RF input ports 403 and 405 and RF signals input at the input ports 403 and 405 will now be combined and output at the signal combiner output 407.

Using the switching arrangement coupled to the signal combiner 401 improves the isolation between the first and second RF input ports 403 and 405 during tuning of parallel RF amplifier stages whose outputs may be connected to the combiner's input ports. This results in more reliable measurements of a particular stage's gain and output power during the tuning process. It also makes possible the performance of s-parameter S22 frequency sweeps for each parallel RF amplifier stage, instead of just for the RF power amplifier as a whole. S22 sweeps involve the injection of a frequency swept signal into the output of an RF amplifier and an RF carrier into the input of the amplifier and are an important test of the stability of a design. Again, the switches 418, 420, 422, 424, 426, 428, and 430 can be any kind of switch that can be opened in an automated fashion, including but not limited to PIN diodes, mechanical switches, one shot switches, and a switch whose connection can be erased in some manner such as a copper or silver strip line that can be severed by a laser beam.

Figure 5:
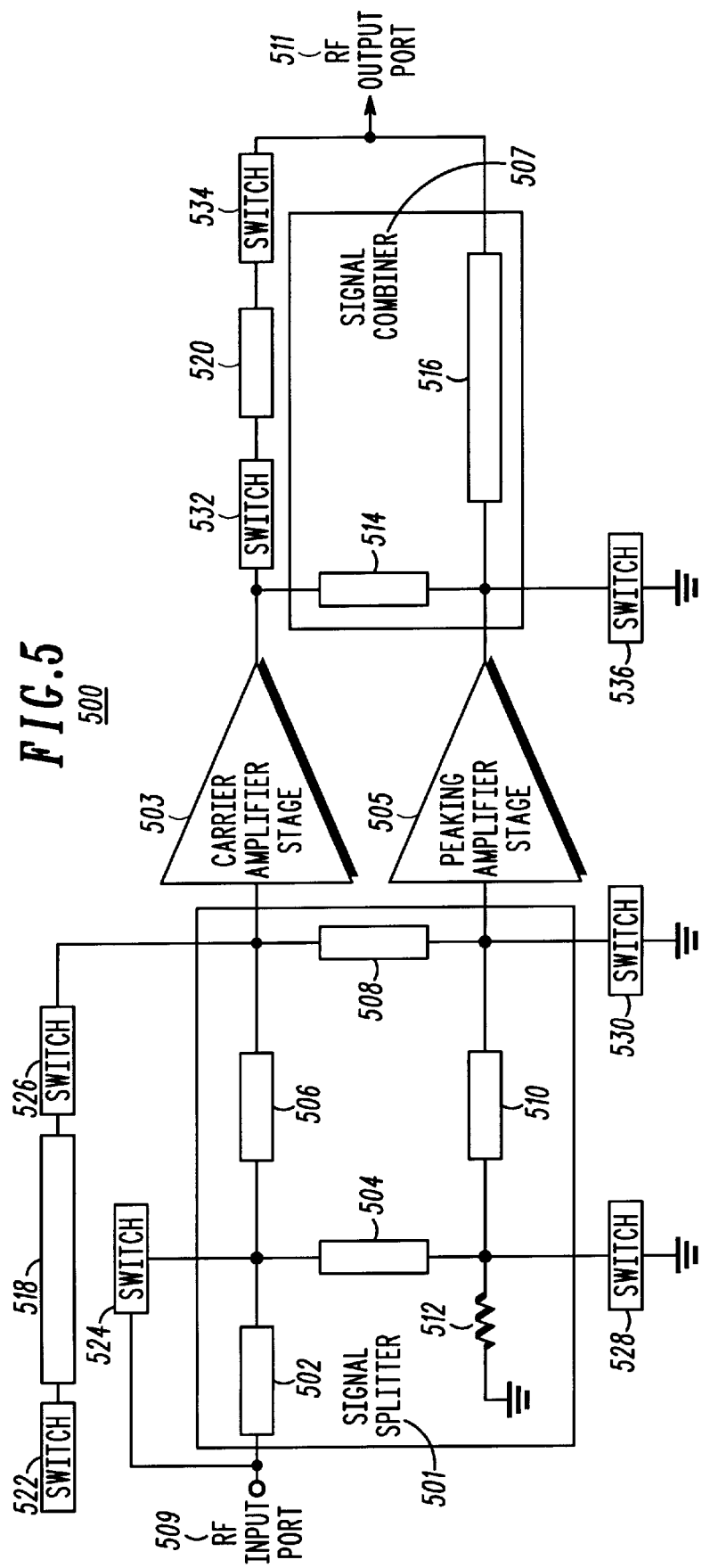
FIG. 5 is a schematic diagram of a switching arrangement coupled to a signal splitter and a signal combiner in accordance with the present invention.

FIG. 5 illustrates an alternative embodiment of a radio frequency amplifier structure 500 in accordance with the present invention, where a first switching arrangement is shown coupled to a signal splitter and a second switching arrangement is shown coupled to a signal combiner. The switching arrangements of the radio frequency amplifier structure 500 are designed for use in the tuning of two parallel amplifier stages where one stage is tuned individually and then the two stages are tuned in combination. An example of such an application is a Doherty-type amplifier such as the one displayed in FIG. 5, which comprises a carrier amplifier stage 503, a peaking amplifier stage 505, a signal splitter 501, a signal combiner 507, an RF input port 509, and an RF output port 511. The signal splitter 501 comprises transmission lines 502, 504, 506, 508, and 510, and a resistor 512. The signal combiner 507 comprises transmission lines 514 and 516. The first switching arrangement comprises transmission line 518 and switches 522, 524, 526, 528, and 530. The second switching arrangement comprises transmission line 520 and switches 532, 534, and 536. The impedances of these transmission lines and resistor may vary depending upon the output impedances of the circuits preceding the signal splitter and combiner and the input impedances of the circuits succeeding the signal splitter and combiner, since there is a transformation from the former impedances to the latter impedances in each instance.

With respect to the Doherty-type amplifier 500, the carrier amplifier stage 503 would be tuned individually and then the entire amplifier circuit, i.e., both the carrier and peaking amplifier stages 503 and 505, would be tuned together. When all switches 522, 524, 526, 528, 530, 532, 534, and 536 are closed, the peaking amplifier stage 505 is isolated from the RF circuit and an RF signal that is input at the RF input port 509 is routed only to the carrier amplifier stage 503 and from the carrier amplifier stage 503 to the RF output port 511. The carrier amplifier stage 503 may then be individually tuned. When all switches 522, 524, 526, 528, 530, 532, 534, and 536 are opened, an RF signal input at the RF input port 509 is split between the carrier amplifier stage 503 and the peaking amplifier stage 505 and then routed from those amplifier stages to the RF output port 511, and the Doherty-type amplifier may be tuned as a whole. Again, the signal splitter 501 and combiner 507 can obscure the performance of the individual amplifier stages 503 and 505. By first isolating the peaking amplifier stage 505 from the RF circuit and independently tuning and measuring the performance parameters of the carrier amplifier stage 503, performance parameters such as efficiency, gain, output power, and return loss can be measured and optimized for the carrier amplifier stage 503 alone. This will facilitate improved overall performance of the Doherty-type amplifier.

Figure 6:
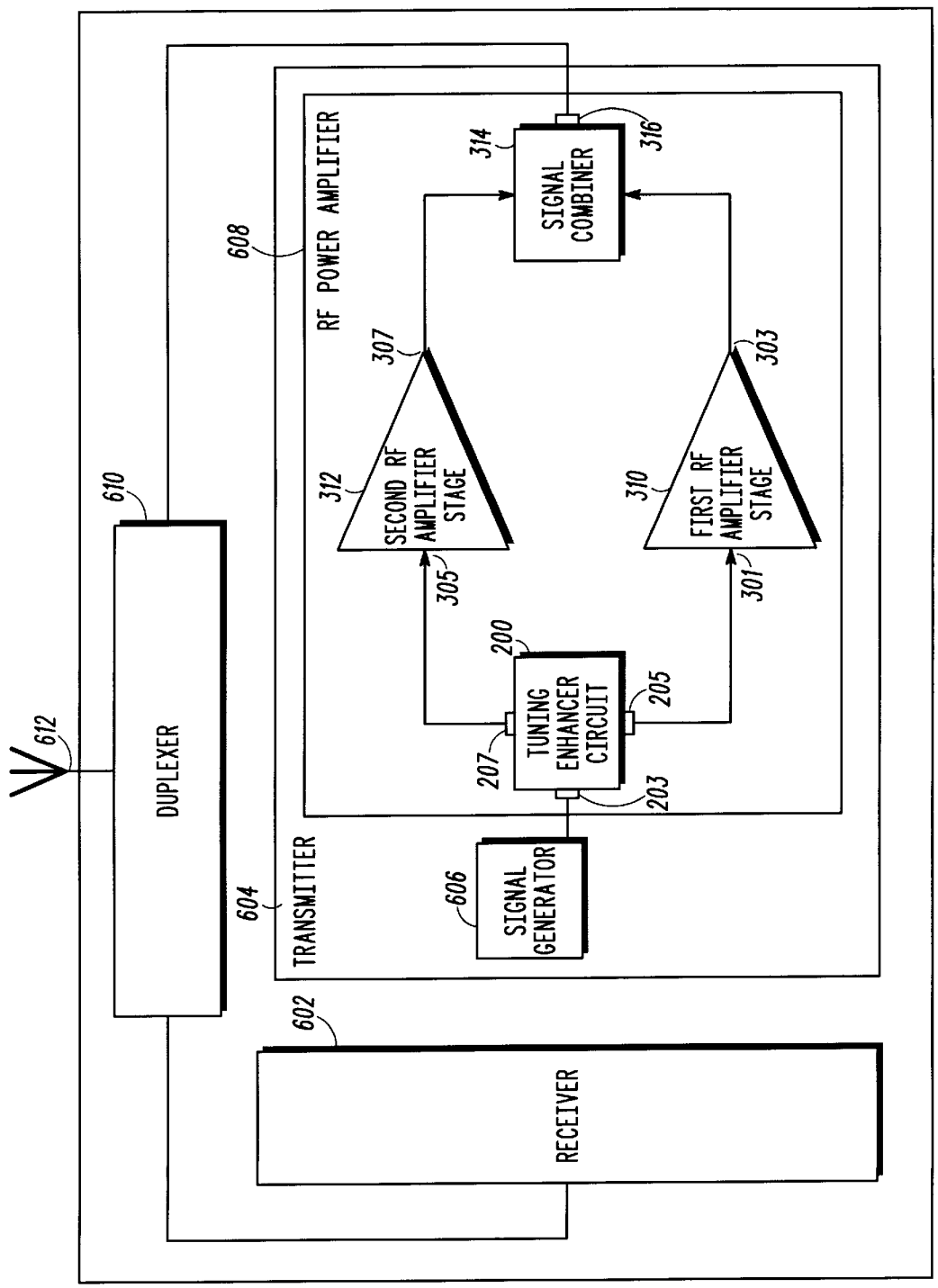
FIG. 6 is a block diagram illustration of a communication device in accordance with the present invention.

FIG. 6 illustrates a communication device 600 in accordance with the present invention. The communication device 600 comprises a receiver 602, a transmitter 604, a duplexer 610, and an antenna 612. The receiver 602 comprises a demodulator, a bandpass filter, local oscillators, mixers, and an intermediate frequency filter. The transmitter 604 comprises a signal generator 606 and an RF power amplifier 608. The RF power amplifier 608 has an RF amplifier structure, the RF amplifier structure comprising a tuning enhancer circuit 200 with an RF input port 203 and a first and second RF output port 205 and 207, a signal combiner 314 with an RF output port 316, and first and second RF amplifier stages 310 and 312 whose inputs, 301 and 305, are coupled to the first and second RF output ports 205 and 207 of the tuning enhancer circuit 200 and whose outputs, 303 and 307, are coupled to the signal combiner 314. The tuning enhancer circuit 200 improves the performance of the first and second RF amplifier stages 310 and 312 by selectively routing to each stage an RF signal input at the RF input port 203 of the tuning enhancer circuit 200 and hence providing for the selective and individual tuning of the stages, thus optimizing the performance of the transmitter 604 as a whole.

The switching arrangement in accordance with the present invention allows for the isolation and automated tuning and optimization of each of several parallel RF amplifiers located on a single circuit board along with their associated signal splitters and combiners. By being able to isolate and tune each RF amplifier separately, improved performance can be achieved out of the amplifier assemblage as a whole. Since the isolation of the amplifiers is done in an automated fashion, it facilitates the quality improvements and cost reductions inherent in a fully automated process. Since the switches are only opened during the process and never closed, very inexpensive switches may be used.

Those skilled in the art appreciate that a variety of signal splitter and combiner designs may be used to accomplish the circuit operations herein. The use of the particular signal splitter/signal combiner/switching arrangements herein is meant to present to the reader examples of such circuits in an effort to better illustrate the principles of the present invention. Also, while the present invention has been particularly shown and described with reference to particular embodiments thereof, it will be understood by those skilled in the art that various changes in form and details may be made therein without departing from the spirit and scope of the present invention.

We claim:

1. A Radio Frequency (RF) amplifier structure, comprising:
   a first RF amplifier having an input and an output;
   a second RF amplifier having an input and an output;
   an RF output port; and
   a signal splitter/switching circuit coupled to the input of the first RF amplifier and the input of the second RF amplifier, the signal splitter/switching circuit comprising:
      at least one RF input port for receiving an RF signal; and
      a switching arrangement, coupled to the at least one RF input port and comprising at least one switch, to selectively switch in a portion of the signal splitter by opening the at least one switch in order to selectively couple the RF signal to the first RF amplifier to provide for tuning optimization of the first RE amplifier, wherein the at least one switch comprises a first switch and a second switch, and wherein the switching arrangement is capable of selectively switching out a portion of the signal splitter by opening the first switch and switching in the portion of the signal splitter by opening the second switch in order to selectively couple the RF signal to the first and second RF amplifiers to provide for tuning optimization of the first and second RF amplifies.

2. The RF amplifier structure of claim 1, further including a signal combiner/switching circuit coupled to the output of the first RF amplifier and the output of the second RF amplifier, the signal combiner/switching circuit comprising:
   at least two RF input ports for receiving RF signals from the first and second RF amplifiers;
   at least one RF output port for transmitting an RF signal; and
   a second switching arrangement coupled to the at least two RF input ports to selectively switch in and out portions of the signal combiner in order to selectively couple RF signals from the first and second RF amplifiers to the at least one RF output port hence providing for tuning optimization of the first and second RF amplifiers.

3. The RF amplifier structure of claim 1, wherein the switching arrangement includes pin diodes.

4. The RF amplifier structure of claim 1, wherein the switching arrangement includes mechanical switches.

5. The RF amplifier structure of claim 1, wherein the switching arrangement includes one shot switches.

6. The RF amplifier structure of claim 1, wherein the switching arrangement includes erasable switches.

7. The RF amplifier structure of claim 6, wherein the erasable switches includes laser trimmable switches.

8. The RF amplifier structure of claim 1, wherein the switching arrangement includes at least one transmission line having an electrical length substantially equal to ¼ wavelengths at an operating frequency.

9. The RF amplifier structure of claim 1, wherein the switching arrangement includes at least one transmission line having an electrical length substantially equal to ¾ wavelengths at an operating frequency.

10. The RF amplifier structure of claim 1, wherein the switching arrangement includes at least one transmission line having an electrical length substantially equal to any factor of (2n−1)/4 wavelengths at an operating frequency, where n=1,2,3, . . . .

11. An RF amplifier arrangement, comprising:
   a first RF amplifier stage having an input and an output;
   a second RF amplifier stage having an input and an output; and
   a tuning enhancer circuit, coupled to the input of the first RF amplifier stage and to the input of the second RF amplifier stage and comprising a plurality of switches, for improving the performance of the first and second RF amplifier stages by selectively routing an RF signal to the first and second RF amplifier stages by successively opening at least one switch of the plurality of switches and hence providing selective and individual tuning of the first and second RF amplifier stages, wherein the at least one switch comprises a first switch and a second switch, and wherein the tuning enhancer circuit is capable of selectively switching out a portion of the tuning enhancer circuit by opening the first switch and switching in the portion of the tuning enhancer circuit by opening the second switch in order to selectively couple the RF signal to the first and second RF amplifiers to provide selective and individual tuning of the first and second RF amplifier stages.

12. A connunication device, comprising:
   a transmitter having an RF amplifier structure, the RF amplifier structure comprising:
      a first RF amplifier stage having an input and an output;
      a second RF amplifier stage having an input and an output; and
      a tuning enhancer circuit, coupled to the input of the first RF amplifier stage and to the input of the second RF amplifier stage and comprising a plurality of switches, for improving the perfomance of the first and second RF amplifier stages by selectively routing an RF signal to the first and second RF amplifier stages by successively opening at least one switch of the plurality of switches and hence providing selective and individual tuning of the first and second RF amplifier stages, wherein the at least one switch comprises a first switch and a second switch, and wherein the tuning enhancer circuit is capable of selectively switching out a portion of the tuning enhancer circuit by opening the first switch and switching in the portion of the tuning enhancer circuit by opening the second switch in order to selectively couple the RF signal to the first and second amplifiers to provide selective an d individual tuning of the first and second RF amplifier stages.

* * * * *